US008592836B2

(12) United States Patent
Yokotani et al.

(10) Patent No.: US 8,592,836 B2
(45) Date of Patent: Nov. 26, 2013

(54) LIGHT EMITTING DEVICE AND ILLUMINATION APPARATUS USING SAME

(75) Inventors: Ryoji Yokotani, Hirakata (JP); Yoji Urano, Ikeda (JP); Ikko Kuzuhara, Toyonaka (JP); Kenichiro Tanaka, Neyagawa (JP)

(73) Assignee: Panasonic Corporation, Osaka (JP)

( * ) Notice: Subject to any disclaimer, the term of this patent is extended or adjusted under 35 U.S.C. 154(b) by 2 days.

(21) Appl. No.: 13/331,028

(22) Filed: Dec. 20, 2011

(65) Prior Publication Data
US 2012/0153313 A1 Jun. 21, 2012

(30) Foreign Application Priority Data

Dec. 21, 2010 (JP) .................................. 2010-284765

(51) Int. Cl.
*H01L 29/18* (2006.01)
(52) U.S. Cl.
USPC .................. 257/88; 257/79; 257/81; 257/82; 257/98; 257/99; 438/22; 438/26; 438/27
(58) Field of Classification Search
None
See application file for complete search history.

(56) References Cited

U.S. PATENT DOCUMENTS

| | | | |
|---|---|---|---|
| 5,976,912 A | 11/1999 | Fukutomi et al. | |
| 6,518,885 B1 | 2/2003 | Brady et al. | |
| 6,583,444 B2 * | 6/2003 | Fjelstad | 257/82 |
| 6,782,610 B1 * | 8/2004 | Iijima et al. | 29/827 |
| 6,936,855 B1 | 8/2005 | Harrah | |
| 7,478,925 B2 | 1/2009 | Hiyama et al. | |
| 7,497,597 B2 | 3/2009 | Suehiro et al. | |
| 7,633,144 B1 | 12/2009 | Kim et al. | |
| 8,022,431 B2 | 9/2011 | Kaneko et al. | |
| 2002/0001869 A1 | 1/2002 | Fjelstad | |
| 2004/0159850 A1 | 8/2004 | Takenaka | |
| 2005/0133808 A1 | 6/2005 | Uraya et al. | |
| 2005/0173708 A1 * | 8/2005 | Suehiro et al. | 257/79 |
| 2006/0034084 A1 | 2/2006 | Matsuura et al. | |
| 2006/0169999 A1 | 8/2006 | Park et al. | |
| 2010/0163898 A1 | 7/2010 | Hung et al. | |

FOREIGN PATENT DOCUMENTS

| | | |
|---|---|---|
| DE | 20 2004 005228 U1 | 5/2005 |
| EP | 1 848 034 | 10/2007 |
| EP | 2 017 897 A1 | 1/2009 |
| JP | S61-026212 | 2/1986 |
| JP | 2005-175292 | 6/2005 |

(Continued)

OTHER PUBLICATIONS

The Japanese Office Action dated May 1, 2012 and the English translation thereof.

(Continued)

*Primary Examiner* — Kyoung Lee
(74) *Attorney, Agent, or Firm* — Bacon & Thomas, PLLC

(57) ABSTRACT

A light emitting device includes a solid light-emitting element; a mounting substrate mounting the solid light-emitting element thereon; an encapsulating member encapsulating the solid light-emitting element; and a lead frame electrically connected to the solid light-emitting element through a wire. The lead frame is arranged on a rear surface of the mounting substrate, and the mounting substrate includes a front mounting surface on which the solid light-emitting element is mounted. The front mounting surface having a smooth surface region covered with the encapsulating member. The mounting substrate further includes a wire hole through which the wire extends from the front mounting surface of the mounting substrate to the rear surface thereof.

15 Claims, 13 Drawing Sheets

(56) References Cited

FOREIGN PATENT DOCUMENTS

| | | |
|---|---|---|
| JP | 2006-54209 | 2/2006 |
| JP | 2006-134992 | 5/2006 |
| JP | 2006-134996 | 5/2006 |
| JP | 2007-073718 | 3/2007 |
| JP | 2007-165843 | 6/2007 |
| JP | 2007-184237 | 7/2007 |
| JP | 2007-184534 | 7/2007 |
| JP | 2007-184540 | 7/2007 |
| JP | 2007-184541 | 7/2007 |
| JP | 2007-184542 | 7/2007 |
| JP | 2007-214522 | 8/2007 |
| JP | 2007-318161 | 12/2007 |
| JP | 2009-130298 | 6/2009 |
| JP | 2009-130299 | 6/2009 |
| JP | 2009-135440 | 6/2009 |
| JP | 2010-129713 | 6/2010 |

OTHER PUBLICATIONS

The European Search Report dated Jan. 8, 2013.
Search Report dated May 8, 2013 issued in corresponding European application No. 11010023.7.

* cited by examiner

LIGHT EMITTING DEVICE AND ILLUMINATION APPARATUS USING SAME

FIELD OF THE INVENTION

The present invention relates to a light emitting device employing a plurality of solid light emitting elements as a light source and an illumination apparatus using the light emitting device.

BACKGROUND OF THE INVENTION

A light emitting diode (hereinafter referred to as "LED") is capable of emitting light with reduced electric power consumption and at increased brightness and has a prolonged lifespan. Thus, attention is paid to the LED as a light source for illumination apparatus which can substitute an incandescent lamp or a fluorescent lamp. Since the light quantity of a single LED is smaller than the light quantity of a fluorescent lamp, a light emitting device provided with a plurality of LEDs is used in a typical illumination apparatus that employs LEDs as a light source.

As one example of the light emitting device of this kind, there is known a light emitting device in which a penetrating wiring portion extending through a substrate from the front surface of the substrate to the rear surface thereof is embedded in the substrate and flip-chip LEDs are electrically connected to the wiring portion provided on the rear surface of the substrate through the penetrating wiring portion (see, e.g., Japanese Patent Application Publication No. 2005-175292 (JP2005-175292A)). Also known is a light emitting device in which a through-hole extending from the front surface of a substrate to the rear surface thereof is formed in the substrate and a wiring layer is arranged in the through-hole (see, e.g., Japanese Patent Application Publication No. 2006-54209 (JP2006-54209A)).

However, the light emitting device disclosed in JP2005-175292A has a complex wiring structure because the penetrating wiring portion is embedded in the substrate. Therefore, the manufacturing cost is likely to increase. Since the LEDs are mounted to the substrate through bumps, the contact area between the LEDs and the substrate becomes smaller. This makes it difficult to efficiently dissipate heat from the LEDs through the substrate. In addition, the light emitting device disclosed in JP2005-175292A is based on a premise that a face-down type element is mounted as for the flip-chip. Therefore, the light emitting device is not suitable for use with a face-up type element.

In the light emitting device disclosed in JP2006-54209A, irregularities are formed on the LED-mounting surface due to the wiring layer and electrodes. This may possibly reduce the adherence of an encapsulating member or the like covering an element. In case where the LEDs are encapsulated by filling a transparent resin into a hollow transparent lens, the resin may flow out due to the existence of irregularities, which may possibly generate voids and consequently reduce the manufacturing efficiency. Since the wiring layer serves as both an LED-mounting surface and an electric wiring line, the contact area between the LEDs and the substrate becomes smaller. This may possibly reduce the heat dissipation of the LEDs.

SUMMARY OF THE INVENTION

In view of the above, the present invention provides a light emitting device which is simple in wiring structure and capable of efficiently dissipate heat from, and an illumination apparatus using the light emitting device.

In accordance with one aspect of the present invention, there is provided a light emitting device includes a solid light-emitting element; a mounting substrate mounting the solid light-emitting element thereon; an encapsulating member encapsulating the solid light-emitting element; and a lead frame electrically connected to the solid light-emitting element through a wire, wherein the lead frame is arranged on a rear surface of the mounting substrate, the mounting substrate including a front mounting surface on which the solid light-emitting element is mounted, the front mounting surface having a smooth surface region covered with the encapsulating member; and a wire hole through which the wire extends from the front mounting surface of the mounting substrate to the rear surface thereof.

The mounting substrate may be formed of a metal plate.

Preferably, the mounting substrate may be configured to serve as a light reflecting member for reflecting light emitted from the solid light-emitting element.

The mounting substrate may be formed of a conductive member, and an insulating member is interposed between the mounting substrate and the lead frame.

It is preferred that the mounting surface of the mounting substrate may include a light reflecting portion for reflecting light emitted from the solid light-emitting element.

The encapsulating member may be made of a resin material containing a phosphor or a pigment.

The light emitting device may further include a diffusing member covering the encapsulating member either directly or through an air layer, the mounting surface extending to a portion of the mounting substrate covered by the diffusing member.

Preferably, the diffusing member may be made of a resin material or a sheet-like material containing a phosphor or a pigment.

The lead frame may make contact with the rear surface of the mounting substrate.

Preferably, the mounting substrate may include an extension portion surrounding the mounting surface.

The extension portion may include a peripheral portion that is bent to the side of the solid light-emitting element.

It is preferred that the lead frame may be covered with an insulating member.

The solid light-emitting element may be provided in plural, the encapsulating member encapsulating the plural solid light-emitting elements.

The solid light-emitting elements may be arranged along a line or in a matrix pattern.

Preferably, the lead frame may include a stress-relieving portion bent perpendicularly to a longitudinal direction of the lead frame.

In accordance with another aspect of the present invention, there is provided an illumination apparatus including the light emitting device disclosed in the one aspect of the present invention.

With the present invention, the solid light emitting element and the lead frame provided on the rear surface of the substrate are electrically connected to each other by the wires extending through the wire holes. This makes it possible to simplify the wiring structure. In addition, the mounting surface includes a smooth surface region. This makes it possible to efficiently dissipate heat from the solid light emitting element.

DETAILED DESCRIPTION OF THE PREFERRED EMBODIMENTS

Figure 1A:
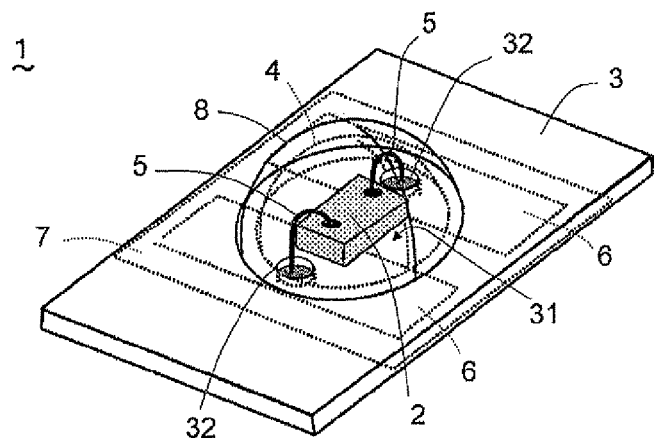
FIG. 1A is a perspective view showing the front surface side of a light emitting device according to a first embodiment of the present invention.
Figure 1B:
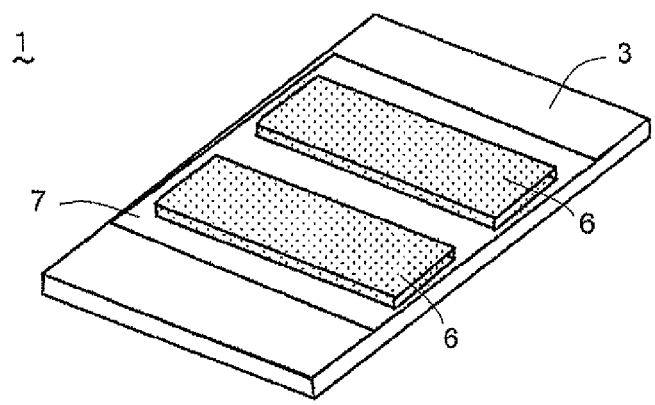
FIG. 1B is a perspective view showing the rear surface side of the light emitting device.
Figure 1C:
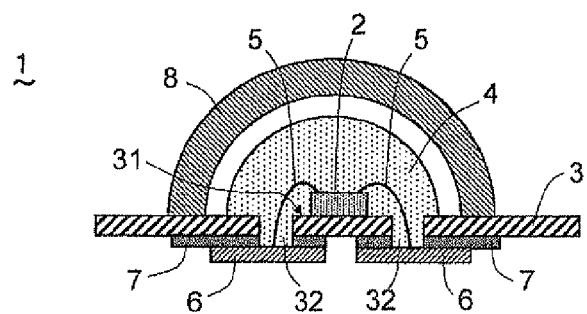
FIG. 1C is a side section view of the light emitting device.

A light emitting device in accordance with a first embodiment of the present invention will now be described with reference to FIGS. 1A through 1C. The light emitting device 1 of the present embodiment includes a light emitting diode (hereinafter referred to as "LED") 2, i.e., a solid light emitting element serving as a light source, and a mounting substrate (hereinafter referred to as "substrate") 3 to which the LED 2 is mounted. The light emitting device further includes an encapsulating member 4 for covering the LED 2 and lead frames 6 electrically connected to the LED 2 by means of wires 5. The lead frames 6 are arranged on the rear surface of the substrate 3. The substrate 3 has a front mounting surface 31 mounted with the LED 2 and provided with a smooth surface region covered with the encapsulating member 4, and wire holes 32 through which the wires 5 are inserted from the front mounting surface 31 of the substrate 3 to the rear surface thereof.

The lead frames 6 are bonded and fixed to the rear surface of the substrate 3 through an adhesive insulating sheet 7. The insulating sheet 7 is formed to have openings in the portions corresponding to the wire holes 32. The lead frames 6 have wire junction portions exposed from the rear surface side of the substrate 3 through the wire holes 32. At the light-outgoing side of the encapsulating member 4, there is provided a wavelength converting member 8 containing a phosphor for converting the wavelength of the light emitted from the LED 2. The wavelength converting member 8 controls the distribution of the light emitted. The center axes of the encapsulating member 4 and the wavelength converting member 8 coincide with the mounting axis of the LED 2. The wavelength converting member 8 is arranged to cover the encapsulating member 4 either directly or through an air layer. In the illustrated example, the wavelength converting member 8 is arranged to interpose an air layer between itself and the encapsulating member 4.

The LED 2 is formed of, e.g., a general-purpose nitride semiconductor. Although the light emitted from the LED 2 may have an arbitrary wavelength, it is preferable for the LED 2 to emit blue light having a peak wavelength of about 460 nm. The size of the LED 2 may preferably be, but is not particularly limited to, □ 0.3 mm. In the present embodiment, a so-called face-up type element having positive and negative electrodes provided on the upper surface thereof is used as the LED 2. When mounting the LED 2, the LED 2 is bonded to the substrate 3 using, e.g., a silicon-based die-bonding material (not shown), and the respective electrodes on the upper surface of the LED 2 are bonded to the lead frames 6 by the wires 5 extending through the wire holes 32 formed in the substrate 3. Thus, the LED 2 and the lead frames 6 are electrically connected to each other. The die-bonding material is not limited to the one stated above but may be, e.g., a silver paste or an epoxy-based resin material having increased heat resistance.

A flat plate formed of a metal plate, e.g., an aluminum plate, is used as the substrate 3. The wire holes 32 are formed near the portion of the substrate 3 to which the LED 2 is mounted. The term "smooth surface" used herein is intended to mean a surface having irregularities smaller than the thickness of a wiring pattern formed on a typical glass or epoxy-made wiring substrate and to include a surface having irregularities of about 75 μm or less in width. Preferably, the substrate 3 is 1 mm in thickness and is formed into a rectangular shape with a size of □ 5 mm. The material of the substrate 3 is not limited to the one stated above but may be, e.g., a conductive material such as stainless steel or the like, or an insulating material such as alumina ceramic, aluminum nitride or the like. The substrate 3 may be sized and shaped to hold the mounted members such as the LED 2 and the encapsulating member 4. The thickness of the substrate 3 may be set such that the substrate 3 has strength great enough not to suffer from deformation such as bending deformation during a handling process. The wire holes 32 are formed at two points across the LED 2 so that the wires 5 connected to the positive and negative electrodes of the LED 2 can extend through the respective wire holes 32.

The encapsulating member 4 is preferably made of a transparent resin and has a hemispherical cross section. The encapsulating member 4 is formed to have a size great enough to cover the LED 2. After the LED 2 and the lead frames 6 are connected to each other by the wires 5, the wire holes 32 are filled with the same resin as used in forming the encapsulating member 4. Then, the encapsulating member 4 is mounted to the substrate 3. The outer diameter of the encapsulating member 4 is equal to a value obtained by multiplying the diameter of the circumscribing circle of the LED 2 by the refractive index of the material of the encapsulating member 4. For example, if the encapsulating member 4 is made of a silicon resin, the outer diameter of the encapsulating member 4 is 1.41 times as great as the diameter of the circumscribing circle of the LED 2. The encapsulating member 4 is formed by filling the afore-mentioned transparent resin or a resin having the same refractive index as that of the afore-mentioned transparent resin into the concave portion of a bowl-shaped member (not shown) having a size great enough to accommodate the LED 2 and the wires 5. The bowl-shaped member is mounted to the substrate 3 so as to cover the LED 2. As the resin in the concave portion of the bowl-shaped member is cured, the bowl-shaped member and the resin are combined into a single structure. No reflection boundary surface exists between the bowl-shaped member and the resin. Therefore, there occurs no loss of light attributable to the total reflection otherwise occurring within the encapsulating member 4. The material of the encapsulating member 4 is not limited to the one stated above but may be, e.g., an inorganic material such as an epoxy resin or glass. The resin filled in the wire holes 32 may differ from the resin of which the encapsulating member 4 is made.

The wires 5 are formed of, e.g., general-purpose gold wires. The wires 5 may be aluminum wires, silver wires or copper wires. The wires 5 are bonded to the respective electrodes of the LED 2 and the electrode portions of the lead frames 6 by a well-known bonding method such as thermal bonding or ultrasonic bonding.

Figure 2A:
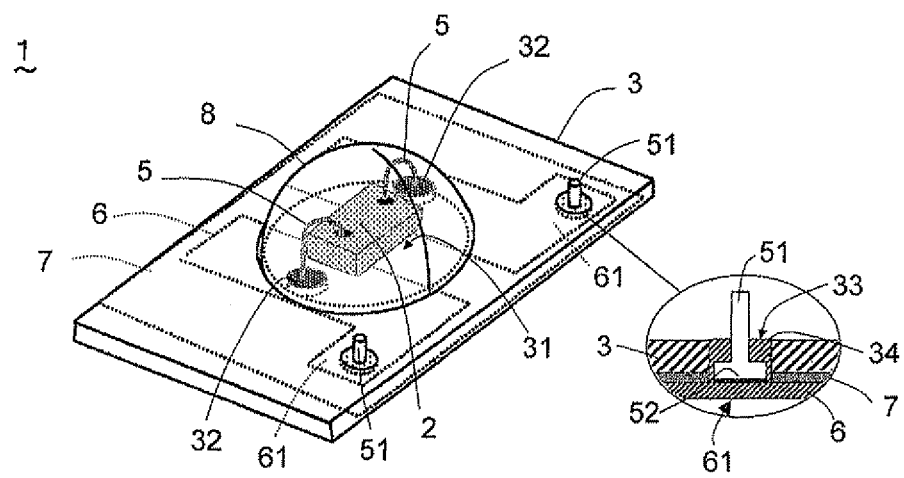
FIG. 2A is a perspective view showing the front surface side of a light emitting device according to a modified example of the first embodiment.
Figure 2B:
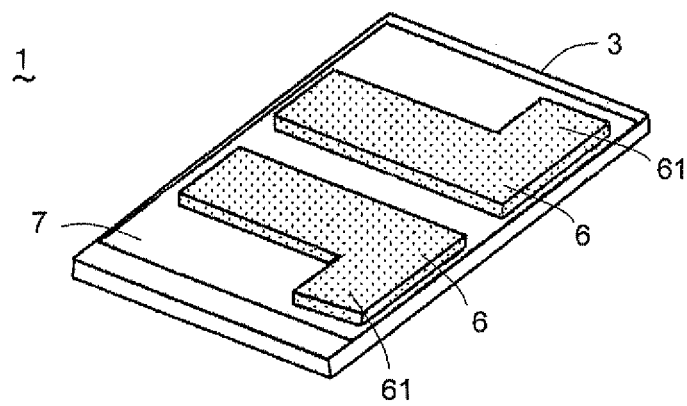
FIG. 2B is a perspective view showing the rear surface side of the light emitting device.

The lead frames 6 are wiring members formed by pressing and blanking a copper hoop material. The surfaces of the lead frames 6 are subjected to surface treatment for anti-oxidation (e.g., Ni plating, Ni/Au plating or Ni/Pd/Au plating). The material of the lead frames 6 is not limited to the one stated above but may be, e.g., aluminum. The lead frames 6 are provided with electrode portions (see FIG. 2A). Power lines are bonded to the electrode portions by soldering. The lead frames 6 are connected to a power supply circuit (not shown) of the light emitting device 1 via the power lines.

The insulating sheet 7 is a sheet-shaped insulating adhesive agent mainly composed of, e.g., a thermosetting resin such as an epoxy resin or the like. Preferably, an adhesive agent having increased heat conductivity and a stress-relieving property is used as the insulating sheet 7. Examples of the adhesive agent include "TSA" produced by Toray Industries, Inc., Japan, and "Organic Green Sheet" produced by Panasonic Electric Works Co., Ltd., Japan.

The wavelength converting member 8 is produced by dispersedly mixing a transparent heat-resistant resin having a refractive index of, e.g., 1.2 to 1.5, (e.g., a silicon resin) and a granular yellow phosphor radiating yellow light when excited by blue light emitted from the LED 2, and forming the mixture into a specified shape. The phosphor dispersed in the transparent material is not limited to the yellow one. A mixture of a plurality of phosphors may be used to adjust the color temperature or the color rendering property. For example, white light having an enhanced color rendering property can be obtained by appropriately mixing a red phosphor and a green phosphor. The wavelength converting member 8 is formed into a hemispherical shape to have an inner diameter greater than the diameter of the encapsulating member 4. Preferably, the wavelength converting member 8 has a thickness of 0.5 to 1 mm.

With the light emitting device 1 of the present embodiment, the mounting surface 31 for attachment of the LED 2 and the lead frames 6 as electric wiring lines are isolated from each other by the substrate 3 interposed therebetween. The LED 2 and the lead frames 6 are electrically connected to each other by the wires 5 extending through the wire holes 32. This helps simplify the wiring configuration. Moreover, the lead frames 6 become structurally simple, which makes it possible to reduce the manufacturing cost. The lead frames 6 are arranged on the rear surface of the substrate 3. The portion of the substrate 3 to which the LED 2 and the encapsulating member 4 are attached, i.e., the mounting surface 31, is formed of a smooth surface. This assists in enhancing the adherence of the encapsulating member 4 and suppressing the generation of voids. The LED 2 and the encapsulating member 4 can be attached with ease. This helps increase the manufacturing efficiency.

Since the mounting surface 31 is smooth, the contact area between the LED 2 and the substrate 3 grows larger. Thus, the heat generated in the LED 2 can be efficiently dissipated through the substrate 3. Since the substrate 3 mounted with the LED 2 is not opened except the wire holes 32, the heat generated in the LED 2 is effectively diffused within the substrate 3. This assists in lowering the temperature of the LED 2.

In the present embodiment, it is preferred that the substrate 3 be formed of a metal plate such as an aluminum plate to serve as a light reflecting member for reflecting the light emitted from the LED 2. With this configuration, the components of the light emitted from the LED 2 toward the substrate 3 are reflected by the substrate 3 positioned just below the LED 2 and are projected from the upper surface of the LED 2. This helps enhance the light extracting efficiency. In this case, the components of the light obliquely emitted from the LED 2 toward the substrate 3 under the horizontal plane of the LED 2 are also reflected by the substrate 3 around the LED 2 and are directed in the light projecting direction. This helps further enhance the light extracting efficiency. Since the substrate 3 is formed of a highly reflective smooth surface except the wire holes 32, it is possible to increase the degree of freedom in arranging the LED 2 and to stably enhance the light extracting efficiency regardless of the arrangement of the LED 2.

A modified example of the light emitting device 1 in accordance with the present embodiment will now be described with reference to FIGS. 2A through 4. In the modified example shown in FIGS. 2A and 2B, electrode portions 61 extend from the lead frames 6. Through-holes 33 are formed in the portions of the substrate 3 just above the electrode portions 61. Pins 51 for the connection of power lines are inserted into the through-holes 33. The portions of the insulating sheet 7 positioned just below the through-holes 33 are removed and the pins 51 are connected to the electrode portions 61 of the lead frames 6 through solders 52. The pins 51 protrude from the front surface of the substrate 3. Wiring lines (not shown) provided with connectors can be electrically connected to the pins 51 by fitting the connectors to the pins 51. An insulating resin material such as a silicon resin is filled in the through-holes 33 around the pins 51. Thus, the pins 51 as power supply terminals are insulated with respect to the substrate 3. With this configuration, it is possible to easily connect the light emitting device 1 to a power source and to enhance the manufacturing efficiency of the light emitting device 1.

Figure 3:
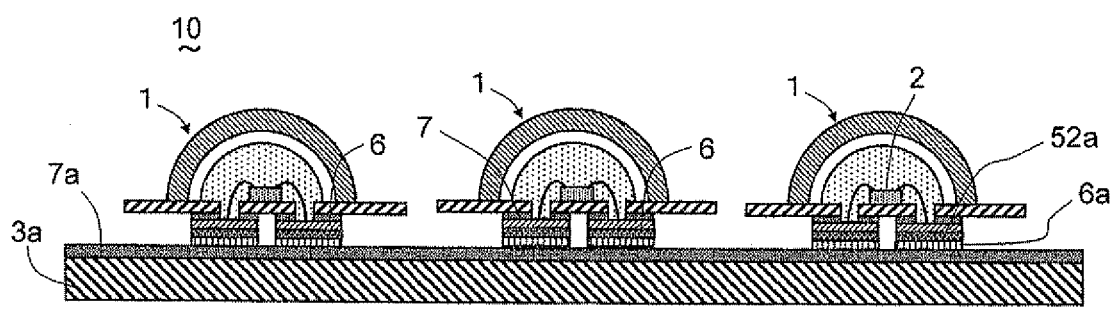
FIG. 3 is a side section view of a light emitting device according to another modified example of the first embodiment.

In a modified example shown in FIG. 3, an illuminating device 10 is configured by arranging a plurality of light emitting devices 1 on a wiring board 3a provided in addition to the substrate 3 to which the LED 2 is mounted. A wiring pattern 6a is formed on the front surface of the wiring board 3a through an insulating layer 7a. The wiring pattern 6a is bonded to the lead frames 6 of each of the light emitting devices 1 via solder layers 52a. Lead lines (not shown) for supplying electric power to the light emitting devices extend from the wiring pattern 6a. With this configuration, it is possible to mount the plurality of light emitting devices 1 on the wiring board 3a and to enhance the manufacturing efficiency of the illuminating device 10.

Figure 4:
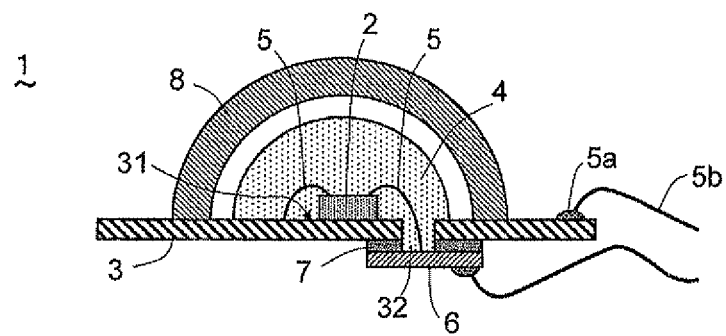
FIG. 4 is a side section view of a light emitting device (an illuminating device) according to a further modified example of the first embodiment.

In a modified example shown in FIG. 4, the substrate 3 is formed of an electrically conductive member. An insulating member 7 interposed between the substrate 3 and the lead frame 6. The substrate 3 is provided with an electrode terminal 5a. A wiring line 5b is connected to the electrode terminal 5a. Thus, the substrate 3 functions as a positive electrode or a negative electrode of the light emitting device 1. With this configuration, the substrate 3 serves as one of the positive and negative electrodes. Therefore, it is only necessary that one of the positive and negative electrodes be formed in the lead frame 6. This helps simplify the configuration of the lead frame 6 and makes it possible to reduce the manufacturing cost. Moreover, since the installation area of the lead frame 6 becomes smaller, it is possible to reduce the installation area of the insulating member 7a and to reduce the amount of use of the insulating member 7a, consequently saving the material cost.

Figure 5:
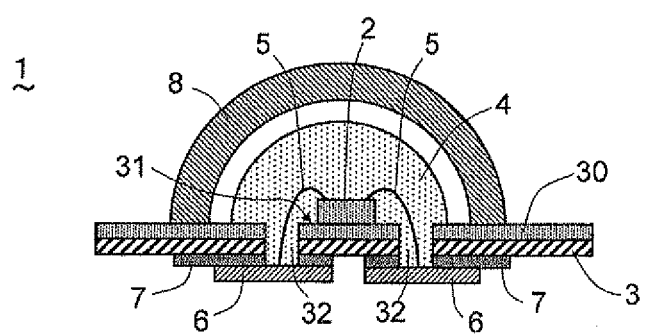
FIG. 5 is a side section view showing a light emitting device according to a second embodiment of the present invention.

Next, a light emitting device in accordance with a second embodiment of the present invention will be described with reference to FIG. 5. In the light emitting device 1 of the present embodiment, a light reflecting portion 30 for reflecting the light emitted from the LED 2 is formed on the mounting surface 31 of the substrate 3. Other configurations remain the same as those of the first embodiment. The light reflecting portion 30 is formed by subjecting the front surface, of the substrate 3 to high reflection treatment. The high reflection treatment can be performed by, e.g., vapor-depositing aluminum or silver on the front surface of the substrate 3 and then forming thereon a protective film made of $SiO_2$. Alternatively, the light reflecting portion 30 may be provided by forming multi-layer films of $SiO_2$ and $TiO_2$ in place of the $SiO_2$ protective film, by chemically grinding an aluminum surface to form a mirror surface and then forming thereon a $SiO_2$ protective film, or by coating a highly reflective white resist.

With this configuration, the components of the light emitted from the LED 2 toward the substrate 3 and the components of the light obliquely emitted from the LED 2 toward the substrate 3 under the horizontal plane of the LED are reflected by the substrate 3 to be directed in the light projecting direction. This helps enhance the light extracting efficiency.

However, if lead frames are plated with silver, it is likely that the silver coat is corroded and degraded under the influence of moistures and heat in the air or the influence of the light emitted from an LED. This sometimes leads to a reduction in the reflectance and the light extracting efficiency (see Japanese Patent Application Publication No. 2003-332628). In addition, the lower surface of a wavelength converting member cannot be covered with lead frames. Therefore, the light travelling from the wavelength converting member toward a chip is not reflected by the silver coat on the lead frames. This sometimes leads to a reduction in the light extracting efficiency. Moreover, if only the lead frames of the substrate surface are plated with silver, the reflectance becomes uneven between the plated region and the non-plated region. Therefore, it is sometimes the case that the light irradiated by a light emitting device becomes uneven.

With the light emitting device 1 of the present embodiment, however, the substrate 3 positioned under the lower surface of the wavelength converting member 8 is provided with the highly reflective portion (the light reflecting portion 30). Accordingly, it is possible to increase the light extracting efficiency and to irradiate the light in a uniform brightness distribution with no unevenness.

Figure 6:
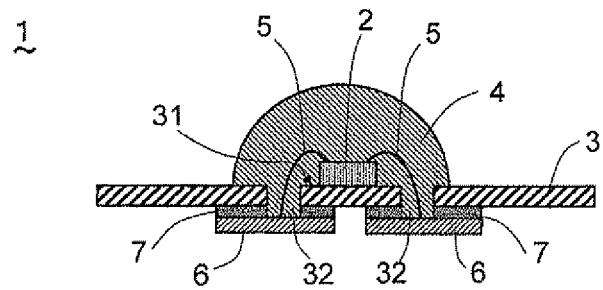
FIG. 6 is a side section view showing a light emitting device according to a third embodiment of the present invention.

Next, a light emitting device in accordance with a third embodiment of the present invention will be described with reference to FIG. 6. In the light emitting device 1 of the present embodiment, the encapsulating member 4 is made of a resin material containing a phosphor or a pigment. Thus, the encapsulating member 4 serves as the wavelength converting member 8 employed in the first embodiment. Other configurations remain the same as those of the first embodiment.

With this configuration, the light converted by the phosphor or the pigment contained in the encapsulating member 4 and the light reflected by the particles of the phosphor or the pigment are readily reflected by the substrate 3. This helps further increase the light extracting efficiency. Since there is no need to provide the wavelength converting member 8, it is possible to increase the manufacturing efficiency and to reduce the manufacturing cost. In addition, since the contact area between the encapsulating member 4 containing the phosphor or the pigment and the mounting surface 31 of the substrate 3 grows larger, it is possible to efficiently transfer the heat generated during the wavelength conversion in the encapsulating member 4 to the substrate 3 and to suppress degradation of the phosphor or the pigment.

Figure 7:
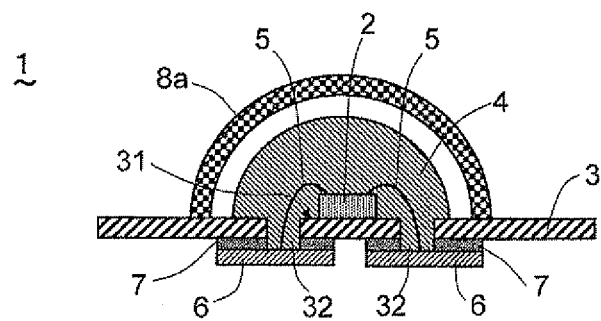
FIG. 7 is a side section view showing a light emitting device according to a fourth embodiment of the present invention.

Next, a light emitting device in accordance with a fourth embodiment of the present invention will be described with reference to FIG. 7. The light emitting device 1 of the present embodiment includes a diffusing member 8a for covering the encapsulating member 4 either directly or through an air layer. The mounting surface 31 of the substrate 3 is expanded to the portion covered by the diffusing member 8a. Other configurations remain the same as those of the third embodiment. The diffusing member 8a is a hemispherical member having a size larger than the encapsulating member 4. The diffusing member 8a is molded by, e.g., a transparent resin mixed with a diffusing agent such as silica.

With this configuration, the light reflected by the diffusing agent particles existing within the diffusing member 8a is readily reflected by the substrate 3. This helps further increase the light extracting efficiency. The light diffused by the diffusing member 8a is partially incident again on the encapsulating member 4 containing the phosphor or the pigment and then re-reflected by the substrate 3. Thus, the wavelength conversion is efficiently performed by the phosphor or the pigment.

The diffusing member 8a may be formed of a resin material or a sheet-like material containing a phosphor or a pigment. In this case, the light converted by the phosphor or the pigment contained in the diffusing member 8a or the light reflected by the particles of the phosphor or the pigment are readily reflected by the substrate 3. This helps further increase the light extracting efficiency. In addition, light having an arbitrary wavelength can be projected by adjusting the kind and addition amount of the phosphor or the pigment mixed into the encapsulating member 4 and the diffusing member 8a.

Figure 8:
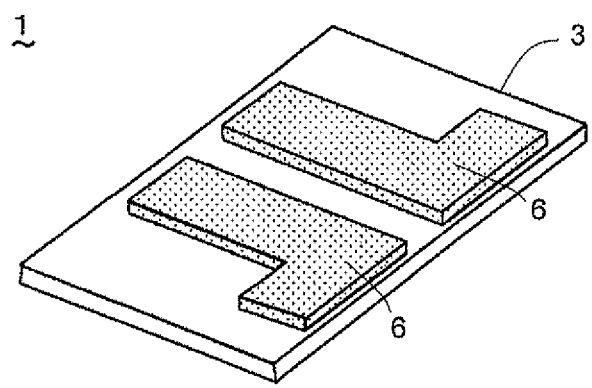
FIG. 8 is a perspective view showing the rear surface side of a light emitting device according to a fifth embodiment of the present invention.

Next, a light emitting device in accordance with a fifth embodiment of the present invention will be described with reference to FIG. 8. In the light emitting device 1 of the present embodiment, the lead frames 6 make contact with the rear surface of the substrate 3. The substrate 3 of the present embodiment is made of ceramic or aluminum nitride. The lead frames 6 are fixed to the rear surface of the substrate 3 by soldering (not shown). Preferably, for the purpose of soldering, a pattern subjected to plating such as nickel plating or gold plating is formed on the region of the rear surface of the substrate 3 to which the lead frames 6 are to be fixed. Other configurations remain the same as those of the first embodiment (particularly, the modified example of the first embodiment).

With this configuration, the lead frames 6 are brought into contact with the substrate 3. Therefore, the thermal resistance between the lead frames 6 and the substrate 3 becomes smaller and the heat is efficiently transferred from the substrate 3 to the lead frames 6. This accelerates dissipation of heat from the substrate 3 through the lead frames 6. Accordingly, it is possible to effectively lower the temperature of the LED 2.

Figure 9:
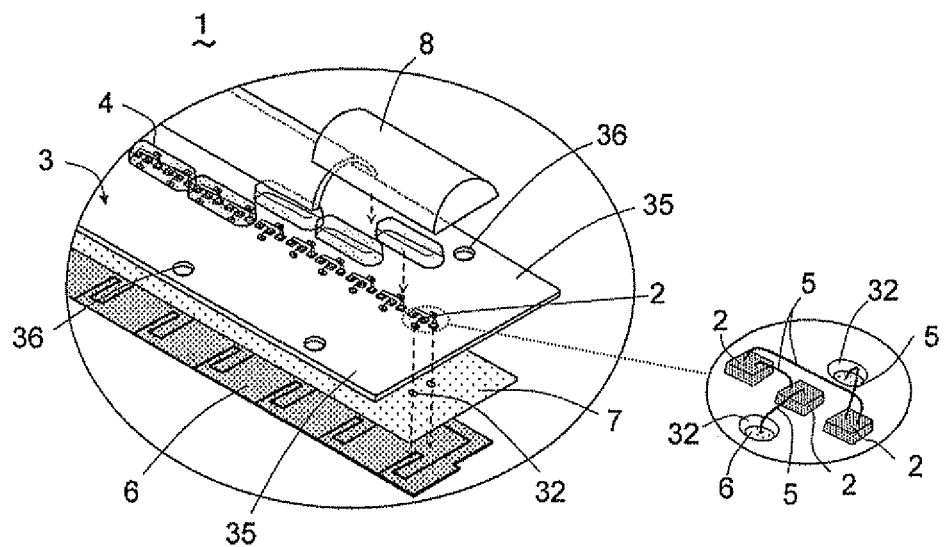
FIG. 9 is a partially-exploded and partially-enlarged perspective view showing the front surface side of a light emitting device according to a sixth embodiment of the present invention.

Next, a light emitting device in accordance with a sixth embodiment of the present invention will be described with reference to FIG. 9. The light emitting device 1 of the present embodiment includes a plurality of LEDs 2 arranged along a line on an elongated substrate 3. The LEDs 2 are encapsulated by a plurality of encapsulating members 4. A wavelength converting member 8 having a hollow semi-cylindrical shape is mounted on the substrate 3 so as to cover the encapsulating members 4. The cross section of the light emitting device 1 orthogonal to the arrangement direction of the LEDs 2 is the same as that of the first embodiment (see FIG. 10).

The LEDs 2 are arranged in an adjoining relationship with one another and are serially connected by wires 5. The LEDs 2 are mounted on the substrate 3 to form a plurality of LED groups. Wire holes 32 are formed in a corresponding relationship with each of the LED groups. The base and tip electrodes of the serially-connected LEDs 2 are electrically connected to the lead frames 6 by the wires 5 extending through the wire holes 32. In the illustrated example, each of the LED groups is composed of three LEDs 2. However, the number of the LEDs 2 included in each of the LED groups is not limited thereto. The lead frames 6 are formed in an appropriate pattern so as to connect the respective LED groups in series or in parallel.

The surface of the substrate 3 is subjected to high reflection treatment. The substrate 3 has extension portions 35 extending from the attachment portion of the wavelength converting member 8 in a direction orthogonal to the arrangement direction of the LED2 2. The extension portions 35 serve as light reflecting portions. Fixing holes 36 for use in fixing the light emitting device 1 to an illumination apparatus 10 are formed in the extension portions 35.

Each of the encapsulating members 4 has a substantially hemispherical cross section and is formed into a tablet-like shape extending along the arrangement direction of the LEDs 2. The encapsulating members 4 are mounted on the substrate 3 in an end-to-end relationship so that each of the encapsulating members 4 can cover a plurality of LEDs 2 (two LED groups in the illustrated example). The wavelength converting member 8 is formed to have a thickness of 0.5 to 1 mm. The wavelength converting member 8 is arranged to cover a plurality of encapsulating members 4. The longitudinal end portions of the wavelength converting member 8 are closed.

With this configuration, the peripheral portion of the mounting surface 31 for mounting the LEDs 2 thereon has increased smoothness. It is therefore possible to collectively cover the LED groups with the encapsulating members 4. This helps increase the manufacturing efficiency. If the LED groups are collectively encapsulated by the encapsulating members 4, the light emitted from the LED groups are equalized by multi-reflection, namely the total reflection in the boundary surface between the interior of the encapsulating members 4 and the air and the reflection in the portions of the substrate 3 just below the encapsulating members 4. Then, the light is incident on the wavelength converting member 8. As a result, the brightness distribution becomes uniform in the entire portion of the wavelength converting member 8, enabling the light emitting device 1 to irradiate light with no unevenness. The provision of the extension portions 35 helps increase the area of the light emitting device 1 occupied by the substrate 3. This increases the area over which the heat of the LEDs 2 is diffused. Accordingly, it is possible to effectively lower the temperature of the LEDs 2 and to enhance heat dissipation of the light emitting device 1.

Figure 10:
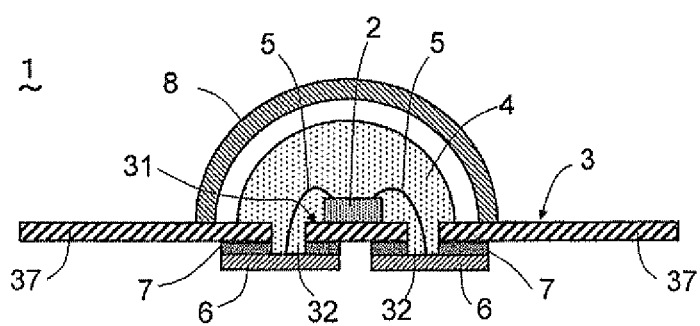
FIG. 10 is a side section view showing a light emitting device according to a seventh embodiment of the present invention.

Next, a light emitting device in accordance with a seventh embodiment of the present invention will be described with reference to FIG. 10. In the light emitting device 1 of the present embodiment, the substrate 3 has extension portions 37 surrounding the mounting surface 31. Just like the mounting surface 31, the extension portions 37 are subjected to high reflection treatment. In the light emitting device 1 employing a single LED 2, the extension portions 37 may be provided to surround either all sides or only two sides of the LED 2 and the wavelength converting member 8. In this case, other configurations remain the same as those of the first embodiment. In the light emitting device 1 employing a plurality of LEDs 2 arranged along a line, the extension portions 37 are arranged along the opposite sides of the row of the LEDs 2. In this case, other configurations remain the same as those of the sixth embodiment (see FIG. 9).

With this configuration, the area of the substrate 3 becomes larger. This increases the area over which the heat of the LED 2 is diffused. Accordingly, it is possible to effectively lower the temperature of the LED 2 and to enhance heat dissipation rate of the light emitting device 1. Moreover, the components of the light projected from the LED 2, the encapsulating member 4 or the wavelength converting member 8 (or the diffusing member 8a) toward the substrate 3 are reflected by the extension portions 37 to travel in the light projecting direction of the light emitting device 1. This helps increase the light projecting efficiency of an illuminating device equipped therein with the light emitting device 1.

Figure 11A:
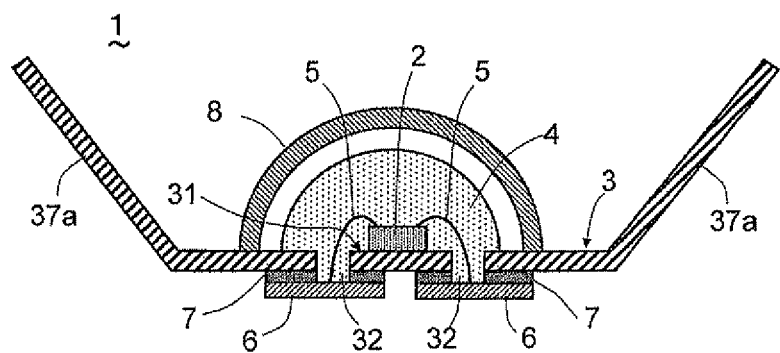
FIG. 11A is a side section view showing a light emitting device according to an eighth embodiment of the present invention.

Next, a light emitting device in accordance with an eighth embodiment of the present invention will be described with reference to FIGS. 11A and 115. In the light emitting device 1 of the present embodiment, the extension portions 37 have peripheral portions 37a that are bent to the side of the LEDs 2. The peripheral portions 37a are bent at, e.g., about 45 degrees, with respect to the mounting surface 31. Just like the mounting surface 31, the peripheral portions 37a are subjected to high reflection treatment.

Figure 11B:
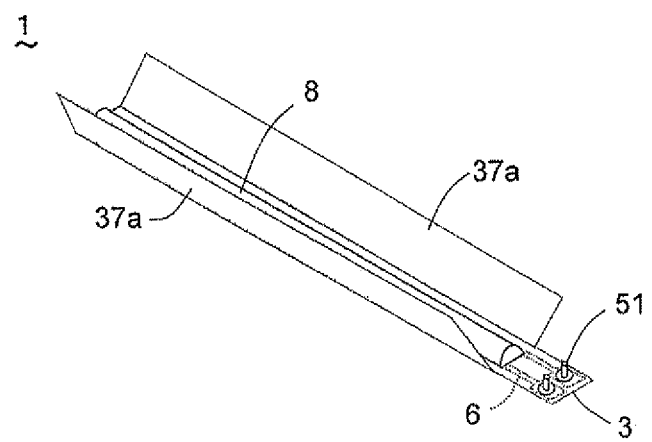
FIG. 11B is a perspective view of the light emitting device.

In the light emitting device 1 employing a single LED 2, the peripheral portions 37a may be provided to surround either all sides or only two sides of the LED 2 and the wavelength converting member 8. In this case, other configurations remain the same as those of the first embodiment. In the light emitting device 1 employing a plurality of LEDs 2 arranged along a line, the peripheral portions 37a are arranged along the opposite sides of the row of the LEDs 2. In this case, the light emitting device 1 has the configuration shown in FIG. 11B. The light emitting device 1 of this configuration includes pins 51 for the connection of power lines as in the modified examples of the first embodiment (see FIGS. 2A and 2B).

With this configuration, there is provided the same effects as in the seventh embodiment. In addition, the light emitted from the LEDs 2 is reflected by the peripheral portions 37a and is projected forward in the optical axis direction of the light emitting device 1. This helps increase the light projecting efficiency of an illuminating device equipped with the light emitting device 1.

Figure 12A:
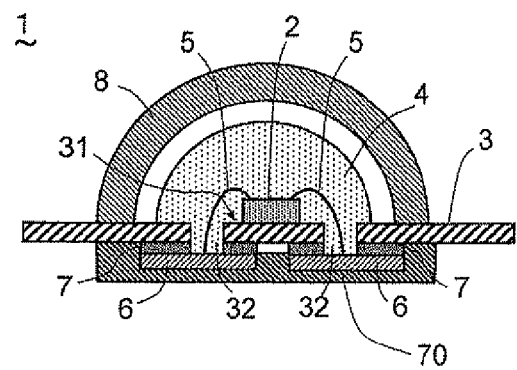
FIGS. 12A through 12C are side section views showing a light emitting device according to a ninth embodiment of the present invention.

Next, a light emitting device in accordance with a ninth embodiment of the present invention will be described with reference to FIGS. 12A to 13B. In the light emitting device 1 of the present embodiment, as shown in FIG. 12A, the lead frames 6 arranged on the rear surface of the substrate 3 are covered with an insulating member 70. The insulating member 70 is made of a highly heat-resistant insulating resin, e.g., a liquid crystal polymer or a polyamide-based thermoplastic resin. Examples of the insulating resin include "Genestar" produced by Kuraray Co., Ltd., Japan, and "Amodel" produced by Solvay S. A., Belgium. The insulating resin may be mixed with highly heat-conductive filler such as MgO, aluminum, carbon fiber or silica. This helps enhance the heat conductivity of the insulating member 70 and the heat dissipation of the light emitting device 1. Preferably, the insulating resin making up the insulating member 70 has heat conductivity of 3 W/mK or more.

FIG. 12A shows an example of the light emitting device in which only the lead frames 6 are covered with the insulating member 70. With this configuration, there is no need to perform a task of positioning an insulating sheet between the light emitting device 1 and the illuminating device for the insulating purposes, when the light emitting device 1 is installed within the illuminating device. It is therefore possible to reduce the manufacturing cost. Since the lead frames 6 are not exposed to the outside, it is possible to prevent degradation or damage of the lead frames 6 and it becomes easy to handle the light emitting device 1. As compared with the light emitting devices shown in FIGS. 12B and 12C, the insulating member 70 can be formed using a reduced amount of insulating resin. Accordingly, it is possible to reduce the manufacturing cost.

Figure 12B:
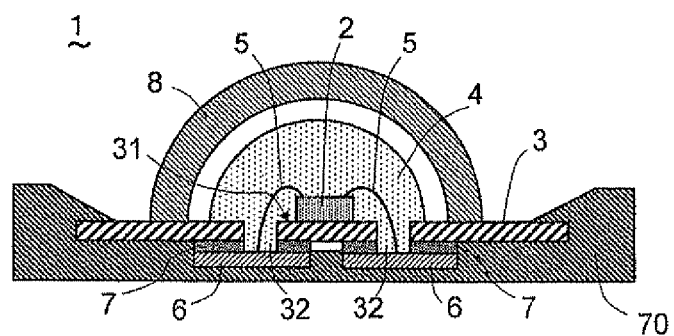
Figure 13A:
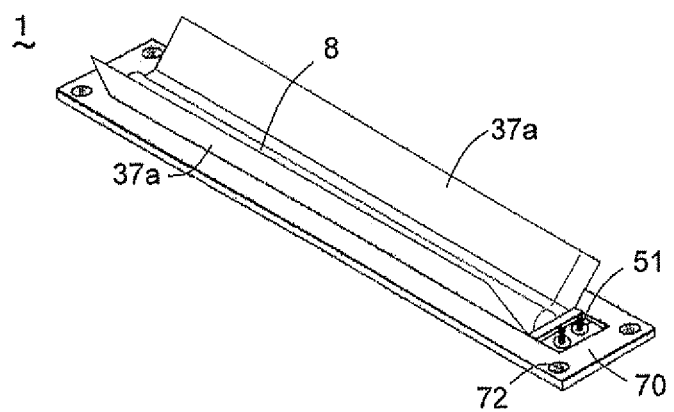
FIGS. 13A and 13B are perspective views of the light emitting device of the ninth embodiment.

FIG. 12B shows an example of the light emitting device in which not only the lead frames 6 but also the peripheral portion of the substrate 3 is covered with the insulating member 70. With this configuration, it is possible to increase the overall strength of the light emitting device 1. FIG. 13A shows a combination of the light emitting device 1 shown in FIG. 12B and the light emitting device 1 of the eighth embodiment (see FIG. 11B). In this configuration, screw fixing portions 72 are provided near the end portions of the insulating member 70. This makes it easy to attach the light emitting device 1 to the illuminating device while increasing the manufacturing efficiency of the illuminating device.

Figure 12C:
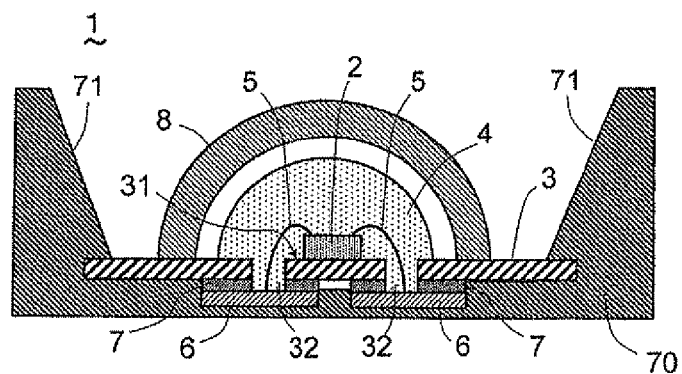
Figure 13B:
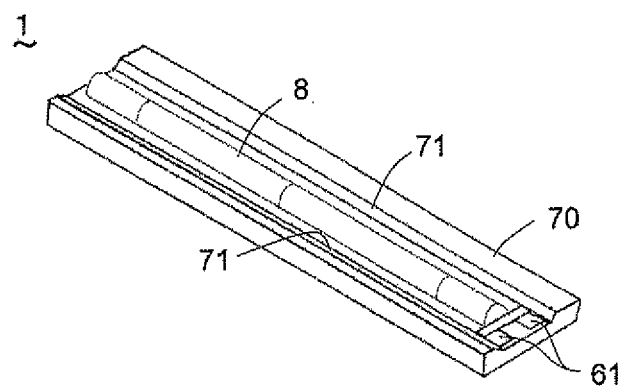

FIG. 12C shows an example of the light emitting device 1 in which slant surface portions 71 having a taper shape are formed in the insulating member 70 to surround the wavelength converting member 8. With this configuration, the slant surface portions 71 are subjected to high reflection treatment by using a highly reflective white resin material, e.g., PBT (polybutylene terephthalate), as the insulating member 70. Accordingly, the light travelling in the transverse direction from the wavelength converting member 8 is reflected by the slant surface portions 71. This makes it possible to irradiate the light in the light projecting direction of the light emitting device 1. FIG. 13B shows a combination of the light emitting device 1 shown in FIG. 12C and the light emitting device 1 of the sixth embodiment (see FIG. 9). In this configuration, the electrode portions 61 of the lead frames 6 are exposed toward the light projecting direction. This makes it easy to connect the electrode portions 61 and the power lines (not shown).

Figure 14A:
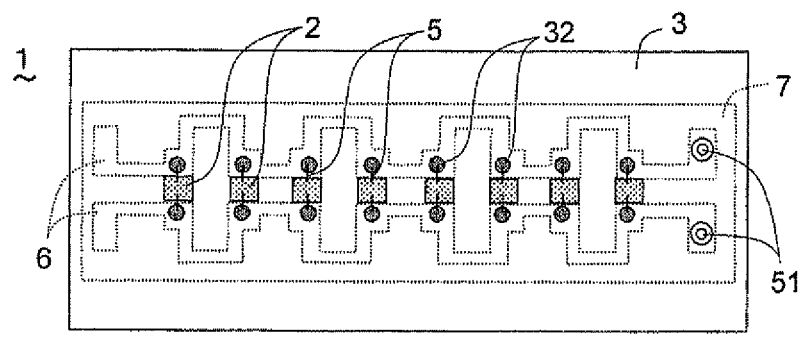
FIG. 14A is a front view showing the front surface side of a light emitting device according to a tenth embodiment of the present invention.
Figure 14B:
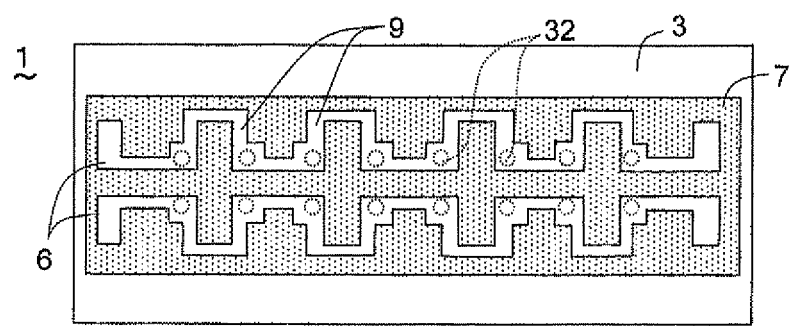
FIG. 14B is a rear view showing the rear surface side of the light emitting device.

Next, a light emitting device in accordance with a tenth embodiment of the present invention will be described with reference to FIGS. 14A and 14B. In the light emitting device 1 of the present embodiment, a plurality of LEDs 2 is arranged along a line. Lead frames 6 are patterned so that the LEDs 2 can be connected in parallel. The lead frames 6 are provided with stress-relieving portions 9 bent perpendicularly to the longitudinal direction of the lead frames 6. In the illustrated example, some components of the light emitting device 1 such as the encapsulating member 4 and the wavelength converting member 8 are omitted. Each of the stress-relieving portions 9 referred to herein is patterned into a generally U-like shape by mating the segments bent perpendicularly to the longitudinal direction of the lead frames 6 and a segment longitudinally extending in a perpendicular relationship with the bent segments and forming a main body of each of the lead frames 6. The shape of the stress-relieving portions 9 is not limited to the illustrated one but may be, e.g., a V-like shape, an M-like shape or an N-like shape.

With this configuration, it is possible to relieve the stresses acting on the lead frames 6, which is caused by the difference in the linear thermal expansion coefficients of the substrate 3 and the lead frames 6. It is also possible to prevent the lead frames 6 from being separated from the substrate 3 and to restrain the substrate 3 from being warped.

Figure 15A:
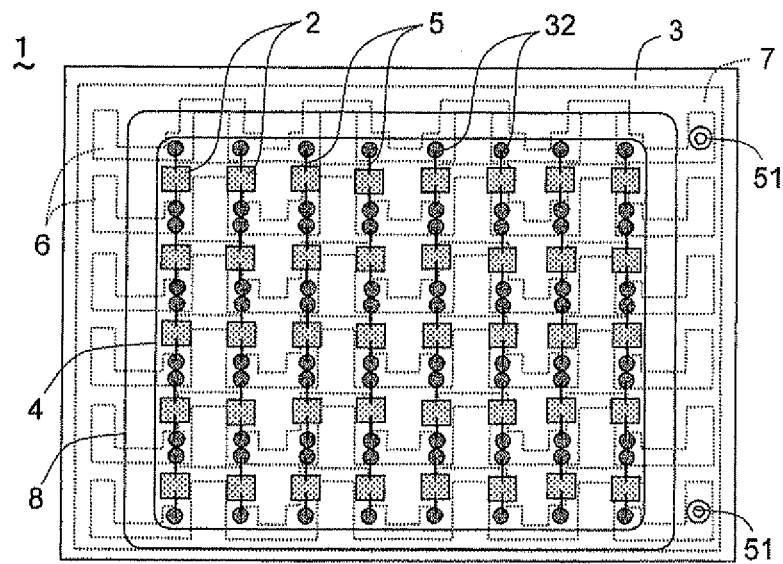
FIG. 15A is a front view showing the front surface side of a light emitting device according to an eleventh embodiment of the present invention.
Figure 15B:
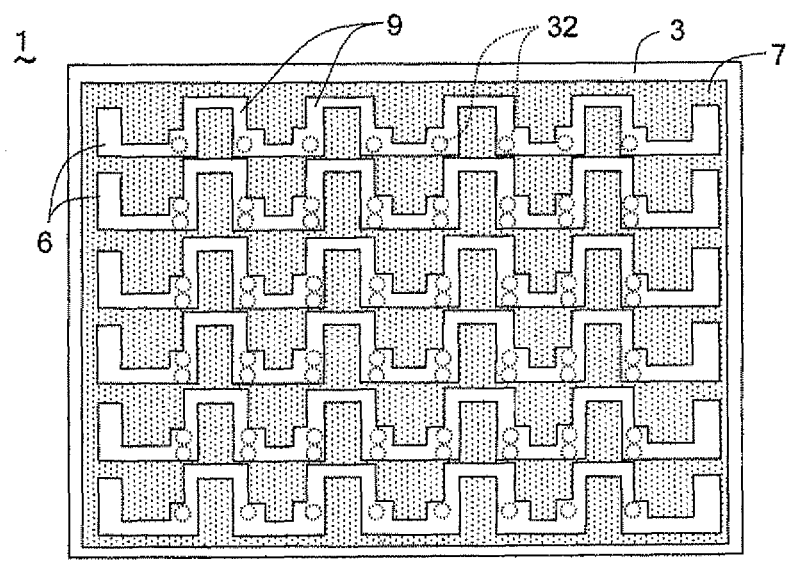
FIG. 15B is a rear view showing the rear surface side of the light emitting device.
Figure 15C:
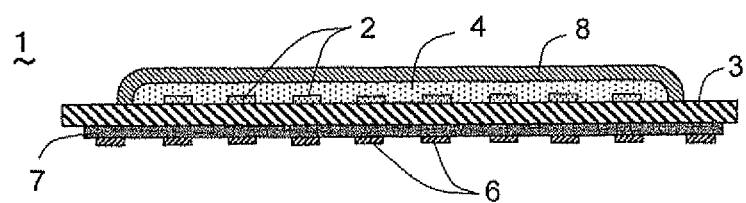
FIG. 15C is a side section view of the light emitting device.

Next, a light emitting device in accordance with an eleventh embodiment of the present invention will be described with reference to FIGS. 15A through 15C. In the light emitting device 1 of the present embodiment, a plurality of LEDs 2 is arranged in a matrix pattern. In the present embodiment, each LED group is made up of eight LEDs 2 arranged along a line. Five rows of the LED groups and the corresponding lead frames 6 are arranged on one substrate 3 at a regular interval. As a result, the LEDs 2 are arranged in a matrix pattern. Just like the tenth embodiment, each of the lead frames 6 is provided with stress-relieving portions 9.

In the LED groups arranged on the substrate 3 except the uppermost and lowermost ones, two adjoining LED groups are connected to one lead frame 6. As a result, eight LEDs 2 in each row are connected to each other in parallel and five LEDs 2 in each column are serially connected to each other in series. An encapsulating member 4 is mounted on the substrate 3 to cover the respective LED groups. A wavelength converting member 8 is mounted on the substrate 3 to cover the encapsulating member 4.

With this configuration, the light emitted from the LEDs 2 is incident on the wavelength converting member 8 through the encapsulating member 4 at a uniform density. Accordingly, it is possible to realize a planar light source capable of emitting light at uniform brightness and with no unevenness.

Next, an illuminating device 10 equipped therein with a plurality of light emitting devices 1 of the eighth embodiment will be described with reference to FIGS. 16A and 16B. The illuminating device 10 includes a device housing 11 opened in the light projecting direction, a plurality of light emitting devices 1 fixed to the device housing 11, a front cover 12 and a rim 13 attached to the opening of the device housing 11 to hold the front cover 12 in place. The lead frames 6 of each of the light emitting devices 1 are connected to a power supply circuit (not shown) for the light emitting devices 1 either directly or indirectly through power lines 5c. The end portions of the substrates 3 of the light emitting devices 1 are pressed against the device housing 11 through the use of a plate member (not shown). The plate member is fixed by screws, thereby fixing the light emitting devices 1 to the device housing 11.

Figure 16A:
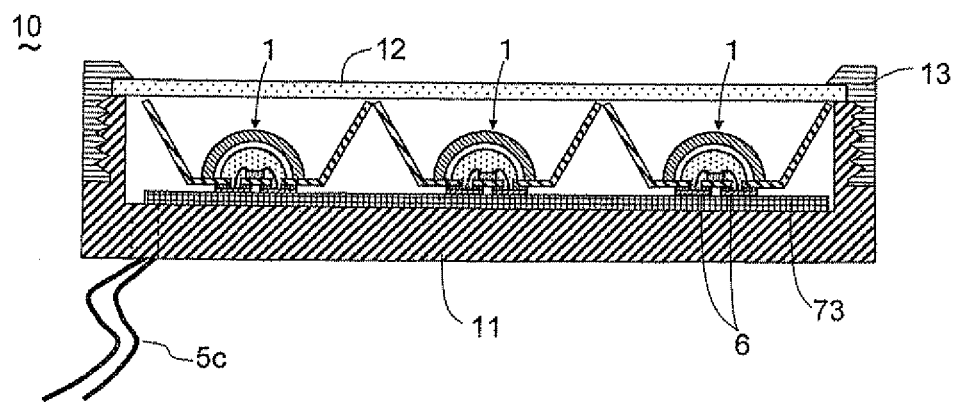
FIGS. 16A and 16B are side section views showing an illuminating device using the light emitting device of the eighth embodiment.
Figure 16B:
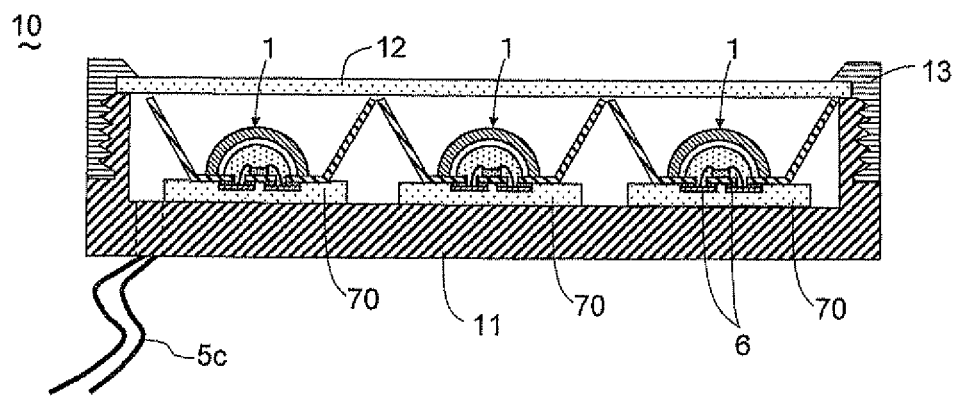

In the illuminating device 10 shown in FIG. 16A, for the sake of insulation, the light emitting devices 1 are fixed to the bottom surface of the device housing 11 through a soft insulating sheet 73 formed by mixing a silicon resin and a highly heat-conductive filler material. The thickness of the insulating sheet 73 may be set to insulate the lead frames 6. In the illuminating device 10 shown in FIG. 16B, the light emitting devices 1 are fixed to the device housing 11 through the insulating member 70 of the ninth embodiment. This illuminating device 10 employs the light emitting devices 1 simple in wiring structure and capable of efficiently dissipating heat from the LEDs 2. It is therefore possible to easily assemble the illuminating device 10 and to reduce the manufacturing cost. It is also possible to stably irradiate the light.

The illuminating device 10 is not limited to the embodiment set forth above but may be modified in many different forms. For example, one of the positive and negative electrodes of each of the LEDs 2 may be connected to the lead frames 6 by the wires 5 in the afore-mentioned manner and the other electrode may be connected in the manner as shown in FIG. 4. The connecting method may be arbitrarily adopted. While the illuminating device 10 described above is equipped therein with a plurality of light emitting devices 1 of the eighth embodiment, the present invention is not limited thereto. Alternatively, the illuminating device 10 may be equipped therein with a plurality of light emitting devices of other embodiments or modified examples thereof.

While the invention has been shown and described with respect to the embodiments, it will be understood by those skilled in the art that various changes and modification may be made without departing from the scope of the invention as defined in the following claims.

What is claimed is:

1. A light emitting device, comprising:
a solid light-emitting element;
a mounting substrate mounting the solid light-emitting element thereon;
an encapsulating member encapsulating the solid light-emitting element; and
a lead frame electrically connected to the solid light-emitting element through a wire,
wherein the lead frame is arranged on a rear surface of the mounting substrate, the mounting substrate including a front mounting surface on which the solid light-emitting element is mounted, the front mounting surface having a smooth surface region covered with the encapsulating member; and a wire hole through which the wire extends from the front mounting surface of the mounting substrate to the rear surface thereof, and
wherein the lead frame includes a stress-relieving portion bent perpendicularly to a longitudinal direction of the lead frame.

2. The light emitting device of claim 1, wherein the mounting substrate is formed of a metal plate.

3. The light emitting device of claim 1, wherein the mounting substrate is configured to serve as a light reflecting member for reflecting light emitted from the solid light-emitting element.

4. The light emitting device of claim 1, wherein the mounting substrate is formed of a conductive member, and an insulating member is interposed between the mounting substrate and the lead frame.

5. The light emitting device of claim 1, wherein the mounting surface of the mounting substrate includes a light reflecting portion for reflecting light emitted from the solid light-emitting element.

6. The light emitting device of claim 1, wherein the encapsulating member is made of a resin material containing a phosphor or a pigment.

7. The light emitting device of claim 1, further comprising: a diffusing member covering the encapsulating member either directly through an air layer, the mounting surface extending to a portion of the mounting substrate covered by the diffusing member.

8. The light emitting device of claim 7, wherein the diffusing member is made of a resin material or a sheet-like material containing a phosphor or a pigment.

9. The light emitting device of claim 1, wherein the lead frame makes contact with the rear surface of the mounting substrate.

10. The light emitting device of claim 1, wherein the mounting substrate includes an extension portion surrounding the mounting surface.

11. The light emitting device of claim 10, wherein the extension portion includes a peripheral portion that is bent to the side of the solid light-emitting element.

12. The light emitting device of claim 1, wherein the lead frame is covered with an insulating member.

13. The light emitting device of claim 1, wherein the solid light-emitting element is provided in plural, the encapsulating member encapsulating the plural solid light-emitting elements.

14. The light emitting device of claim 13, wherein the solid light-emitting elements are arranged along a line or in a matrix pattern.

15. An illumination apparatus comprising the light emitting device of claim 1.

* * * * *